United States Patent
Sankarakrishnan

(10) Patent No.: US 10,370,764 B2
(45) Date of Patent: Aug. 6, 2019

(54) ISOLATOR FOR A SUBSTRATE PROCESSING CHAMBER

(71) Applicant: Applied Materials, Inc., Santa Clara, CA (US)

(72) Inventor: Ramprakash Sankarakrishnan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 678 days.

(21) Appl. No.: 14/522,196

(22) Filed: Oct. 23, 2014

(65) Prior Publication Data

US 2015/0122775 A1    May 7, 2015

Related U.S. Application Data

(60) Provisional application No. 61/900,845, filed on Nov. 6, 2013.

(51) Int. Cl.
| | |
|---|---|
| H01L 21/00 | (2006.01) |
| C23C 16/00 | (2006.01) |
| C23C 16/513 | (2006.01) |
| H01J 37/32 | (2006.01) |
| C23C 16/509 | (2006.01) |

(52) U.S. Cl.
CPC .......... *C23C 16/513* (2013.01); *C23C 16/509* (2013.01); *H01J 37/32091* (2013.01); *H01J 37/32467* (2013.01); *H01J 37/32477* (2013.01)

(58) Field of Classification Search
CPC .................. C23C 16/42567; H01J 37/32467
See application file for complete search history.

(56) References Cited

U.S. PATENT DOCUMENTS

| | | | |
|---|---|---|---|
| 5,705,019 A * | 1/1998 | Yamada ............ | H01J 37/32174 156/345.44 |
| 5,885,356 A | 3/1999 | Zhao et al. | |
| 5,908,508 A * | 6/1999 | Vanell ................. | C23C 16/455 118/723 E |
| 6,050,216 A * | 4/2000 | Szapucki .......... | C23C 16/45565 118/723 E |
| 6,398,929 B1 | 6/2002 | Chiang et al. | |

(Continued)

FOREIGN PATENT DOCUMENTS

| | | |
|---|---|---|
| JP | 2000-64051 A | 2/2000 |
| JP | 2000064051 A * | 2/2000 |

(Continued)

OTHER PUBLICATIONS

PCT international search report and written opinion of PCT/US2014/061888 dated Jan. 26, 2015. The PCT Search Report is being used as the English translation for, KR-10-2012-0134352.

(Continued)

*Primary Examiner* — Sylvia MacArthur
*Assistant Examiner* — Michelle Crowell
(74) *Attorney, Agent, or Firm* — Patterson + Sheridan, LLP

(57) ABSTRACT

A processing kit for a plasma processing chamber. The processing kit includes a plurality of ceramic arc-shaped pieces. Each arc-shaped piece has a concave first end and a convex second end and the first end of each arc-shaped piece is configured to mate with an adjacent end of a neighboring arc-shaped piece to form a ring shaped inner isolator.

17 Claims, 3 Drawing Sheets

(56) References Cited

U.S. PATENT DOCUMENTS

| | | | |
|---|---|---|---|
| 6,583,980 B1 * | 6/2003 | Wang | H01L 21/6831 |
| | | | 361/233 |
| 2001/0004478 A1 | 6/2001 | Zhao et al. | |
| 2011/0284100 A1 * | 11/2011 | Kudela | C23C 16/45565 |
| | | | 137/343 |
| 2012/0031561 A1 | 2/2012 | Kim | |
| 2012/0281334 A1 * | 11/2012 | Sasaki | H01L 21/6831 |
| | | | 361/234 |

FOREIGN PATENT DOCUMENTS

| | | |
|---|---|---|
| KR | 10-2012-0134352 A | 12/2012 |
| TW | 201019390 A | 5/2010 |

OTHER PUBLICATIONS

TW Office Action dated Dec. 11, 2017 for Application No. 103137455.
TW Search Report for Application No. 103137455 dated Jul. 31, 2018.

* cited by examiner

US 10,370,764 B2

ISOLATOR FOR A SUBSTRATE PROCESSING CHAMBER

CROSS-REFERENCE TO RELATED APPLICATIONS

This application claims benefit of U.S. Patent Provisional Application No. 61/900,845, filed Nov. 6, 2013, which is incorporated by reference in its entirety.

FIELD

Embodiments described herein relate to semiconductor manufacturing apparatus and methods. Specifically, embodiments described herein relate to isolators for use in a plasma processing chamber.

BACKGROUND

In the process of fabricating modern semiconductor integrated circuits (ICs), it is necessary to develop various material layers over previously formed layers and structures. Reliably reproducing submicron and smaller features is one of the key requirements of very large scale integration (VLSI) and ultra large scale integration (ULSI) of semiconductor devices. However, with the continued miniaturization of circuit technology, the dimensions of the size and pitch of circuit features have placed additional demands on processing capabilities. Consistent and reliable formation of these features is critical to further increases in device and interconnect density. The circuit densities require process parameters to be held to smaller tolerances and for the process environment to remain uniform from one circuit to a next.

The uniformity of processing conditions has always been important to semiconductor manufacturing. As the critical dimensions of devices continue to decline and the geometry complexity increase, the tolerance for non-uniformity in the processing conditions is declining. Non-uniformity arises from numerous causes, which may be related to device properties and interruption of operations, among other reasons.

The interruption of the manufacturing process may occur due to device maintenance and chamber component failures. Starting up the manufacturing process after an interruption often results in non-uniformity in the processing conditions until the process can stabilize. The interruption is expensive from both a production and a quality control perspective. The inventors have discovered that improvements to process kits using the plasma chambers can increase uniformity of processing results by extending the service life.

SUMMARY

A processing kit for a plasma processing chamber. The processing kit includes a plurality of ceramic arc-shaped pieces. Each arc-shaped piece has a concave first end and a convex second end and the first end of each arc-shaped piece is configured to mate with an adjacent end of a neighboring arc-shaped piece to form a ring shaped inner isolator.

Additional embodiments described herein provide a processing kit for a plasma processing chamber. The processing kit includes a plurality of ceramic arc-shaped pieces. Each arc-shaped piece has a concave first end and a convex second end. The first end of each arc-shaped piece is configured to mate with an adjacent end of a neighboring arc-shaped piece to form a ring shaped inner isolator. The inner walls of the arc-shaped pieces have a common diameter. The first end of each arc-shaped piece has a gap defined between adjacent ends that prevent line-of-sight between the inner wall and an outer wall of the ring shaped inner isolator. The inner wall of the ring shaped inner isolator has a radius of about 7.499 inches to about 7.501 inches. The outer wall of the ring shaped inner isolator has a radius of about 8.599 inches to about 8.601 inches, and the ring shaped inner isolator has a thickness of about 0.397 inches to about 0.403 inches.

Additional embodiments described herein provide a method for processing a substrate in a processing chamber. In operation, a substrate may be processed by forming plasma in a processing chamber containing the substrate disposed on a substrate support. Characteristics of the plasma may be controlled by providing power to an electrode layer disposed between a wall and a lid of the processing chamber. The electrode layer is isolated from the wall and the lid by an outer ceramic isolator and an inner ceramic isolator. The outer ceramic isolator is in contact with the chamber wall and the electrode layer, while the inner ceramic isolator is in contact with the electrode layer and a liner disposed inward of the wall of the processing chamber. The inner ceramic isolator does not contact the chamber wall of the processing chamber. The substrate may be processed in the processing chamber without cracking or damaging the inner ceramic isolator.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein are for a process kit which includes one or more thermal and RF isolators. The isolator of the process kit isolates RF power from a chamber body while minimizing damage to the isolator from thermal stress. The isolator is exposed to very hot temperatures inside the chamber body while the chamber body itself may be substantially at ambient temperatures. By decoupling the isolator from the chamber body, temperature gradients across the isolator are substantially reduces compared to conventional designs. Additionally, the isolator may be fabricated in separate pieces to further minimize stress due to thermal cycling. Gaps between the separate pieces of the isolator are configured to prevent line of sight between the plasma and chamber body, thereby preventing arcing.

Figure 1:
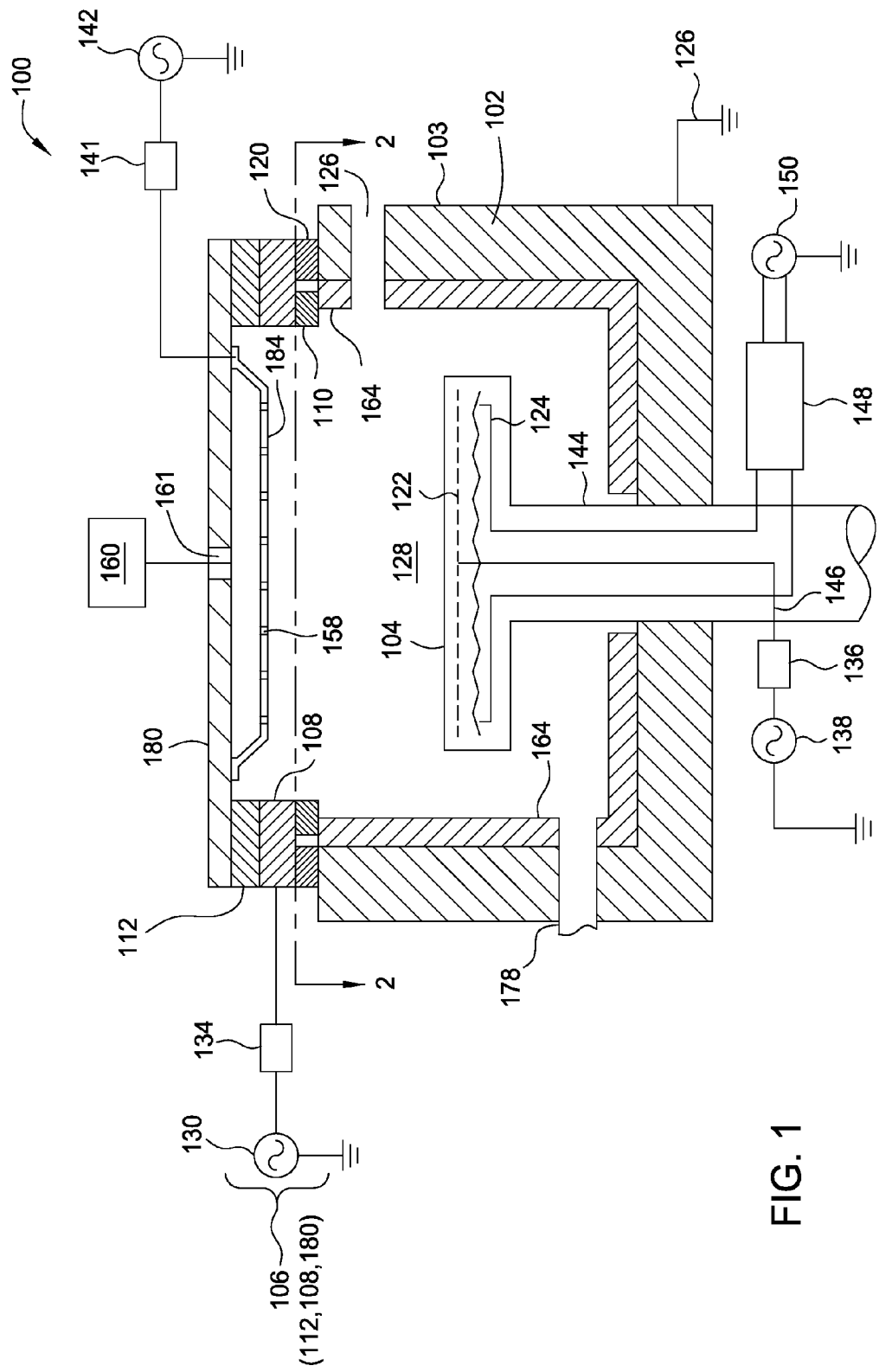
FIG. 1 is a schematic cross-sectional view of a processing chamber having chamber components that include a process kit having at least one isolator.

FIG. 1 is a schematic cross-sectional view of a processing chamber 100 having chamber components that include a process kit having one or more inner isolators 110. The processing chamber 100 includes a chamber body 102, a substrate support 104 disposed inside the chamber body 102, and a lid assembly 106 coupled to the chamber body 102. The lid assembly 106 encloses the substrate support 104 inside a processing volume 128. Substrates may be provided into the processing volume 128 through an opening 126 in a chamber wall 103 of the processing chamber 100. The opening 126 may be conventionally sealed for processing using a door slit valve. The chamber wall 103 may have a liner 164. The liner 164 may surround the chamber wall 103 and substantially prevent the chamber wall 103 from being exposed to plasma formed in the processing volume 128. The liner 164 also protects the chamber walls 103 from the process gasses and deposition of process by-products.

A gas panel 160 is coupled to the lid assembly 106. The gas panel 160 provides process and/or cleaning gases to the processing volume 128 of the chamber 100. The gas panel 160 may contain a plurality of sources for the process gasses. For example, the gas panel 160 may contain a source for a silicon or carbon precursor and a carrier gas source. The precursor may combine in a vaporizer and mix with an oxygen source prior to entering the processing volume 128. Various control features of the gas panel 160 have been omitted for the sake of brevity.

A pumping port 178 is formed through the chamber wall 103 of the chamber body 102 and connected to the processing volume 128. The pumping port 178 may be located at any convenient location along the chamber body 102. A pumping device (not shown) is coupled through the pumping port 178 to the processing volume 128 to evacuate and control the pressure therein. The pumping device may include one or more pumps and throttle valves.

The lid assembly 106 comprises an electrode layer 108, one or more isolators 110, 120, 112 and a lid 180. The lid assembly 106 may be opened to allow access to the processing volume 128 of the processing chamber 100 for maintenance. The lid 180 is sealed with, and supported on, the isolator ring 112.

A showerhead 184 is coupled to an interior surface of the lid 180. The showerhead 184 includes a plurality of apertures 158. Process gases flow from the gas panel 160 through an inlet port 161 formed through the lid 180 into the showerhead 184 and out the apertures 158 into the processing volume 128 of the processing chamber 100. The apertures 158 may have a predefined distribution across the showerhead 184 to affect the rate and distribution of the process gasses.

An RF source power supply 142 is coupled through a matching network 141 to the showerhead 184. In one embodiment, the RF source power supply 142 is capable of generating up to about 3000 W at a tunable frequency of about 50 kHz to about 13.56 MHz.

The electrode layer 108 may be disposed between the isolator ring 112 and isolators 120, 110 atop the chamber wall 103. The electrode layer 108 may be an annular or ring-like member, and may be a ring electrode. The electrode layer 108 may be a continuous loop around a circumference of the processing chamber 100 surrounding processing volume 128, or may be discontinuous at selected locations if desired. The isolator rings 112, 110, 120 each of which may be a dielectric material such as a ceramic or metal oxide, for example aluminum oxide and/or aluminum nitride, contacts the electrode layer 108 and separates the electrode layer 108 electrically and thermally from the chamber components, such as the chamber wall 103 and the lid 180.

The electrode layer 108 may be coupled to a tuning circuit 134 that controls a ground pathway of the processing chamber 100. The tuning circuit 134 may comprises an electronic sensor and an electronic controller. The tuning circuit 134 may be an LLC circuit comprising one or more inductors. A power supply 130 is coupled through the tuning circuit 134 to electrode layer 108. The power supply 130 may be DC power, pulsed DC power, RF power, pulsed RF power, or a combination thereof.

The isolator rings 112, 110, 120 may be fabricated from a dielectric material such as a ceramic or metal oxide. For example, the isolator rings 110, 112, 120 may be formed from yttria, aluminum oxide and/or aluminum nitride. The isolator rings 110, 112, 120 may contact the electrode layer 108 and separate the electrode layer 108, electrically and thermally, from the lid 180 and the chamber wall 103 of the processing chamber 100.

The inner isolator 110 and the outer isolator 120 are disposed below and contact the electrode layer 108. The inner isolator 110 may be disposed atop the liner 164 and is exposed to the processing volume 128 of the processing chamber 100. The outer isolator 120 may be disposed adjacent to and radially outward of the inner isolator 110 and disposed atop the chamber wall 103 of the processing chamber 100. Since the chamber wall 103 of the processing chamber may be at or near ambient room temperature, the outer isolator 120 is shielded from the high temperatures in the processing volume 128 of the processing chamber 100 by the inner isolator 110. Since the inner isolator 110 does not touch the outer isolator 120 or the cooled chamber wall 103, the temperature gradient, and thus stress, is minimized across the inner isolator 110, particularly as compared to conventional designs which contact the chamber body and are exposed to the processing volume 128.

A second electrode 122 may be coupled to the substrate support 104. The second electrode 122 may be embedded within the substrate support 104. Alternately, the second electrode 122 may be coupled to a surface of the substrate support 104. The second electrode 122 may be a plate, a perforated plate, a mesh, a wire screen, or any other distributed arrangement. The second electrode 122 may be a tuning electrode, and may be coupled to a second tuning circuit 136 by a conduit 146, disposed in a shaft 144 of the substrate support 104. The second tuning circuit 136 may have a second electronic sensor and a second electronic controller, and is coupled to a second power supply 138. The second power supply 138 may be DC power, pulsed DC power, RF power, pulsed RF power, or a combination thereof.

A third electrode 124, which may be a bias electrode, may be part of the substrate support 104. The third electrode may be coupled to a second source of electric power 150 through a matching circuit 148. The second source of electric power 150 may be DC power, pulsed DC power, RF power, pulsed RF power, or a combination thereof.

The process kit, containing one or more of the isolator rings 112, 110, 120 may be used with any suitably adapted processing chamber configured for plasma or thermal processing. One example of a plasma processing chamber with which the isolator rings 112, 110, 120 may be beneficially used is the PRODUCER® processing chamber available from Applied Materials, Inc., located in Santa Clara, Calif.

Chambers from other manufacturers may also be used with the components described above.

In operation, a substrate is disposed on the substrate support 104 and may be subjected to an electrical bias using the third electrode 124. Process gases are flowed through the lid assembly 106 according to a desired flow plan. RF power is coupled to the showerhead 184 to establish a plasma in the processing volume 128. Upon energizing the plasma in the processing volume 128, a potential difference is established between the plasma and the electrode layer 108. A potential difference is also established between the plasma and the second electrode 122. The process temperature, of the processing chamber 100 near electrode layer 108, may range between about 1000 degrees Celsius and about 1800 degrees Celsius for annealing; about −25 degrees Celsius to about +500 degrees Celsius for etching and post etch treatment; and about 300 degrees Celsius to about 500 degrees Celsius for vapor deposition. A temperature differential across the isolators 110, 120 may be significant due to the temperature differential between the process temperature and the ambient temperature from the chamber wall 103.

Quality and performance of the processing chamber 100 may be affected by the conditions in the processing chamber 100. Uninterrupted operation of the processing chamber 100 contributes to good uniformity of processing results. However, high temperature gradients in chamber components may damage those chamber components. For example, conventional isolator rings that are exposed to ambient temperatures at one end and to very high temperatures at another end may induce high thermal stress across the isolator which may cause the isolator to crack or break, and thus require chamber downtime for replacement. This problem is mitigated by having a thermal break, e.g. a gap, between the outer isolator 120 which is in contact with the ambient chamber wall 103 and the inner isolator 110 which is exposed to high processing temperatures within the processing volume 128. Neither isolator 110, 120 is subjected to the full temperature differential. Thus, the isolators 110, 120 have lower thermal stress and a larger service life.

Figure 2:
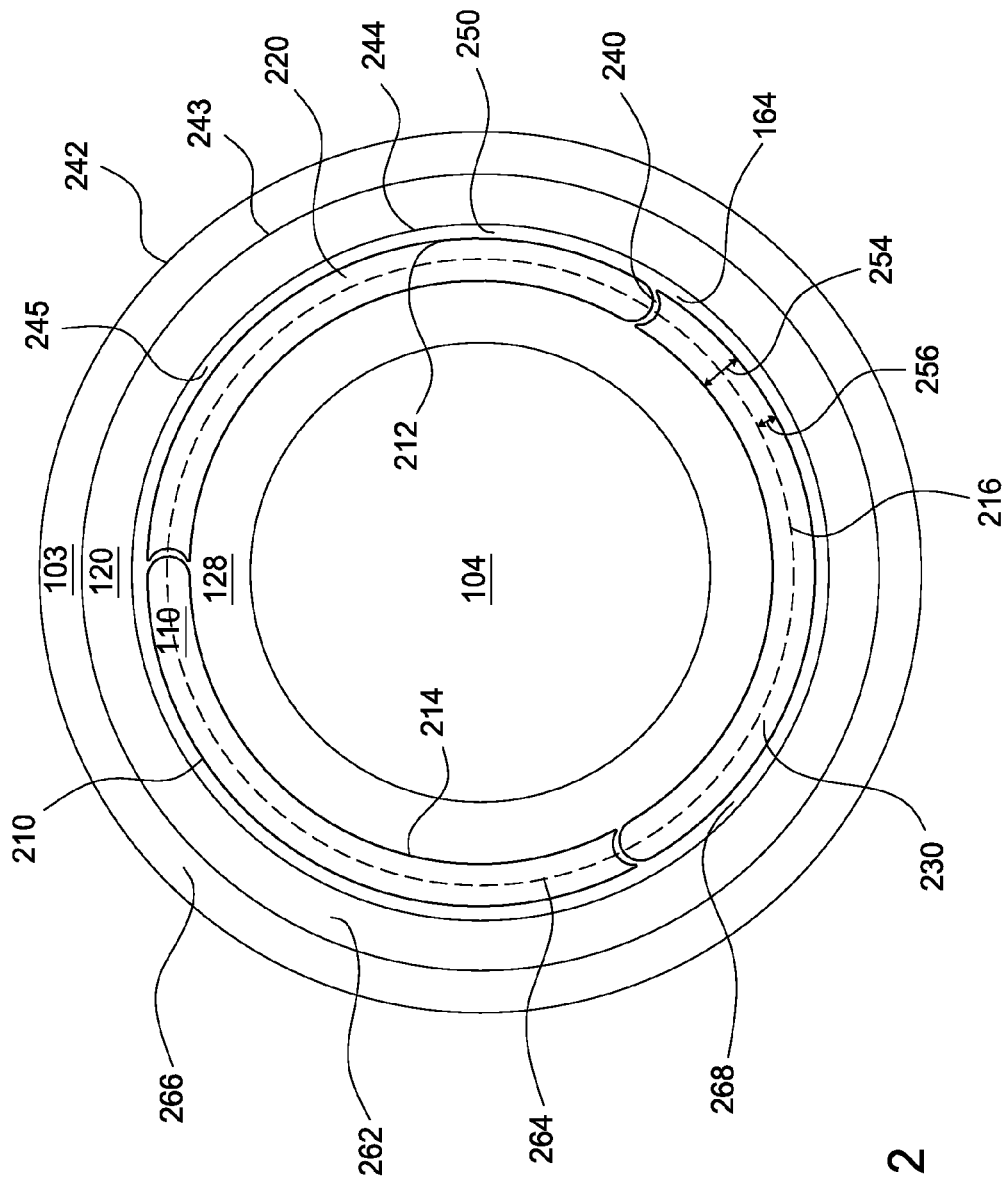
FIG. 2 is a cross-sectional view of the processing chamber taken along cross-section line 2-2 of FIG. 1, illustrating an inner isolator.

FIG. 2 is a cross-sectional view of the processing chamber 100 along section line 2-2, according to one embodiment. The cross-sectional view includes the chamber wall 103, the outer isolator 120, the inner isolator 110, the liner 164 and the substrate support 104. The chamber wall 103 may have a top surface 266 and an outer surface 242. The outer surface 242 is exposed to ambient temperatures of the environment in which the processing chamber 100 is located. The liner 164 may have a top 268. The top 268 supports the inner isolator 110. The liner 164 is exposed to the high temperatures of the process environment inside the processing chamber 100. In one embodiment, the top 268 of the liner 164 and the top surface 266 of the chamber wall 103 are coplanar. In another embodiment, the top 268 of the liner 164 and the top surface 266 of the chamber wall 103 are non-planar.

The outer isolator 120 may be a one piece solid ring shaped. The outer isolator 120 may be deposed on the top surface 266 of the chamber wall 103. The outer isolator 120 may have an inner diameter 244, an outer diameter 243 and a top surface 262. In one embodiment, the outer diameter 243 of the outer isolator 120 may be deposed inward of the outer surface 242 of the chamber wall 103. In another embodiment, the outer diameter 243 of the outer isolator 120 may be significantly aligned with the outer surface 242 of the chamber wall 103.

The inner diameter 244 of the outer isolator 120 may be substantially aligned with an inside diameter 245 of the chamber wall 103 of the chamber. In some embodiments, the outer isolator 120 does not overlap the top 268 of the liner 164, and thus is not in good thermal contact with the liner 164. The inner diameter 244 of the outer isolator 120 is configured to accept the inner isolator 110 therein. In one embodiment, the inner diameter 244 of the outer isolator 120 may be about 17.200 inches (436.88 mm) or more.

The outer isolator 120 generally includes a ring shaped body 121 that may be fabricated from a ceramic material. Examples of acceptable materials may be include an electrically and thermally nonconductive materials such as yttria ($Y_2O_3$), aluminum nitride (AlN), alumina ($Al_2O_3$), or other suitable material. In one or more embodiments, the outer isolator 120 is comprised substantially from an aluminum oxide, for example, 99.5% pure $Al_2O_3$ by weight. The $Al_2O_3$ material of the outer isolator 120 provides enhanced resistance to corrosion while providing excellent electrical resistance to isolate the electrode layer 108 (as shown in FIG. 1). Thereby improving the service lifetime of the chamber component and reducing maintenance cost.

The inner isolator 110 may also be ring shaped. The inner isolator 110 may be deposed on the top 268 of the liner 164. The inner isolator 110 may have an inner perimeter 214, an outside edge 212 and a top surface 264. The top surface 264 of the inner isolator 110 and the top surface 262 of the outer isolator 120 may be coplanar. Additionally, the top surfaces 264, 262 of the inner isolator 110 and the outer isolator 120 seal against the electrode layer 108 (as shown in FIG. 1).

The inner isolator 110 may be comprised of one or more pieces to form a complete ring. For example, the inner isolator 110 may have a first piece 210, a second piece 220 and a third piece 230. An expansion gap 240 is defined between adjacent ends of the one or more pieces 210, 220, 230 of the inner isolator 110. In one embodiment, the one or more pieces 210, 220, 230 are equal in shape and size. In another embodiment, the one or more pieces 210, 220, 230 are similar in shape but vary in arc length (discussed below) such that the combination of the one or more pieces 210, 220, 230 may complete the complete circular ring shape of the isolator ring 112.

The inner perimeter 214 of the inner isolator 110 is exposed to the processing volume 128 and elevated temperatures therein. The inner perimeter 214 may extend inward of an inner surface 216 (shown in phantom) of the liner 164. In some embodiments, the top 268 of the liner 164 may have a width 256 smaller than a width 254 associated with the inner isolator 110 deposed thereon. The high temperature of the process environment may cause the inner isolator 110 to experience a temperature gradient from the inner perimeter 214 to an outside edge 212 of the inner isolator 110 that faces the outer isolator 120.

The outside edge 212 of the inner isolator 110 may be significantly aligned with the intersection of the liner 164 and the chamber wall 103. The outside edge 212 of inner isolator 110 is configured to be smaller than the inner diameter 244 the outer isolator 120 and disposed therein. A gap 250 may be formed between the outside edge 212 of the inner isolator 110 and the inner diameter 244 of the outer isolator 120. The gap 250 provides a thermal break that inhibits the heat from conducting from the inner isolator 110 to the outer isolator 120.

The gap 250 and the expansion gap 240 may allow the first piece 210, second piece 220 and third piece 230 of the inner isolator 110 to expand without causing stresses in the inner isolator 110 and the outer isolator 120. Advantageously, thermal expansion of the first piece 210, second piece 220 and third piece 230 of the inner isolator 110 does not exert significant pressure on each other or the outer isolator 120. Thus, the gap 250 and the expansion gap 240 mitigate cracking and other failures in the inner isolator 110 due to the stresses created by the thermal expansion of the inner isolator 110.

The inner isolator 110 may be a dielectric material such as a ceramic or metal oxide. The pieces 210, 220, 230 of the inner isolator 110 may be fabricated from a ceramic material. Examples of acceptable materials may be include an electrically and thermally nonconductive materials such as yttria ($Y_2O_3$), aluminum nitride (AlN), alumina ($Al_2O_3$), or other suitable material. In one or more embodiments, the inner isolator 110 is comprised of substantially from aluminum oxide, for example, pure 99.5% $Al_2O_3$ by weight. The $Al_2O_3$ material of the inner isolator 110 provides enhanced resistance to corrosion while providing excellent electrical resistance to isolate the electrode layer 108 (as shown in FIG. 1). Thereby improving the service lifetime of the chamber component and reducing maintenance cost.

Figure 3:
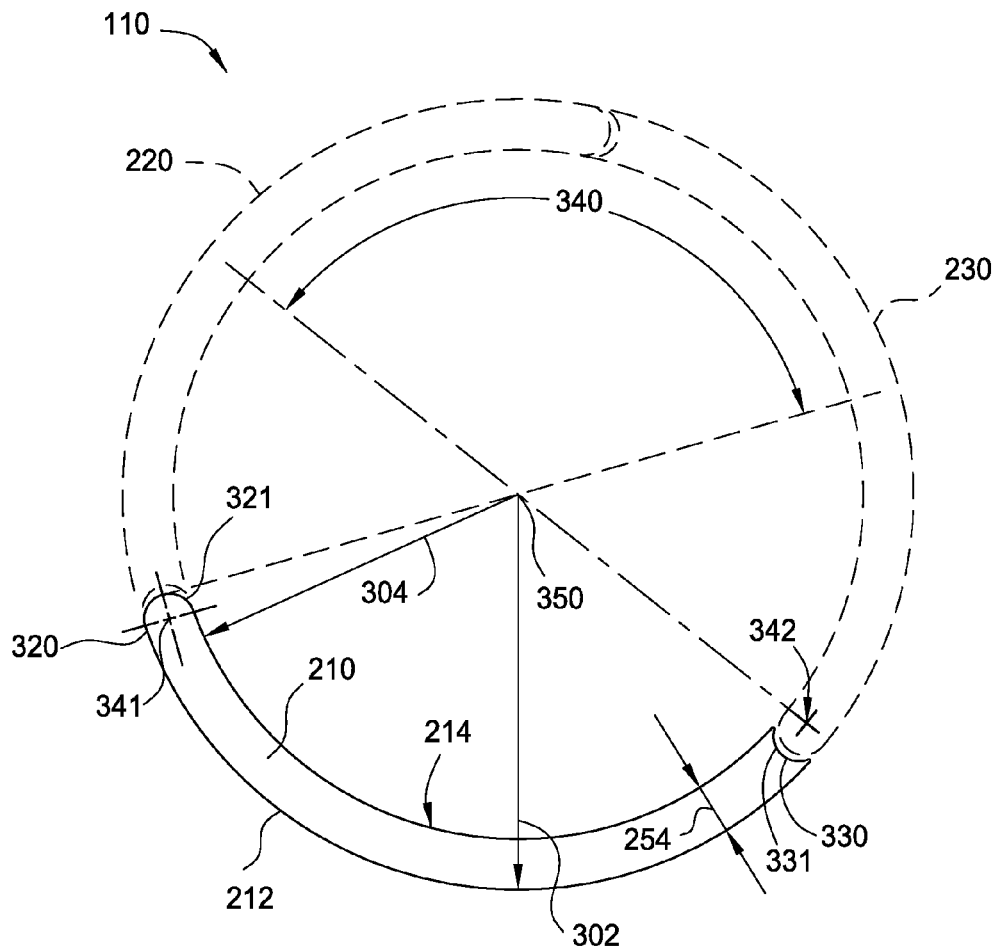
FIG. 3 is a top plan view of a first piece of the inner isolator shown in FIG. 2.

FIG. 3 is a top plan view for the first piece 210 of the inner isolator 110 shown in FIG. 2, according to one embodiment. The second and third pieces 220, 230 may be substantially identical. The first piece 210 may have a first end 320 and a second end 330. The first piece 210 may additionally have an arc shape. The first piece 210 may have an arc length 340 from the first end 320 to the second end 330. In one embodiment, the arc length 340 of the first piece 210 may comprise an arc of about 120 degrees. The arc length 340 along the arc may be about 18.014 inches (457.56 mm) to about 18.010 inches (457.45 mm).

Figure 4:
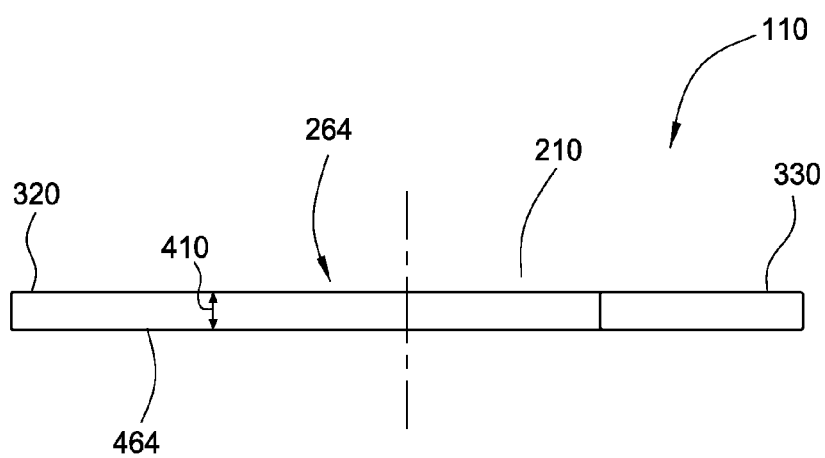
FIG. 4 is a side elevation of the inner isolator shown in FIG. 2.

Turning to FIG. 4, a side projection of the first piece 210 is shown. The first piece 210 may have a bottom surface 464 and a thickness 410 which extends from the bottom surface 464 to the top surface 264. The thickness 410 of the first piece 210 may be about 0.397 inches (10.08 mm) to about 0.403 inches (10.24 mm).

Returning to FIG. 3, the first end 320 has a radius which forms a convex semi-circular end 321. The radius of the convex semi-circular end 321 may have a center 341 which may be congruent with and passes through the first piece 210. The radius is tangent at both the inner perimeter 214 and the outside edge 212 of the first piece 210. Thus the radius is half the width 254 of the first piece 210. In one embodiment, the radius of the first piece 210 may be about 0.550 inches (13.97 mm).

The second end 330 has a radius which forms a concave curved end 331. The radius 332 may have a center 342 which may be non-congruent with the first piece 210. In one embodiment, the concave curved end 331 has a radius of about 0.550 inches (13.97 mm).

To form the inner isolator 110, the first end 320 of the first piece 210 is configured mate with the second end of the second piece 220 with the expansion gap 240 between the first piece and the second piece 220; the first end of the second piece 220 mates with second end of the third piece 230 with the expansion gap 240 between the second piece 220 and the third piece 230; and to complete the circle, the first end of the third piece 230 mates with the second end 330 of the first piece 210 with the expansion gap 240 between the first piece 210 and the third piece 230. The expansion gaps 240 between the separate pieces 210, 220, 230 of the inner isolator 110 are configured to prevent line of sight between the plasma and chamber body, thereby preventing arcing. As the inner isolator 110 is heated by the elevated temperatures present in the processing volume 128, the expansion gaps 240 allow the first, second and third pieces 210, 220, 230 to individually thermally expand, thus allowing the inner isolator 110 as a whole to freely expand without undue stress generation that would be present if fabricated as a single piece ring. Advantageously, the one or more pieces mitigate the thermal stress in the chamber components by alleviating the pressure forces exerted while the inner isolator thermally expands with the elevated process temperatures.

The first piece 210 may be configured to fit a plasma processing chamber for a 200 mm, 300 mm, 450 mm or other sized substrate. The first piece 210, configured for a 300 mm diameter substrate, may have an inner radius 304 and an outer radius 302. In one embodiment, the inner radius 304 for the first piece 210 may be between about 7.499 inches (190.47 mm) to about 7.501 inches (190.52 mm). The outer radius 302 for the outside edge 212 may be between about 8.601 inches (218.47 mm) to about 8.599 inches (218.41 mm).

Isolating the inner isolator 110 from ambient temperatures found on the chamber wall 103 prevents thermal stresses, due to thermal expansion, from damaging or cracking the inner isolator. The expansion gaps 240 throughout the inner isolator 110 facilitate low stress thermal expansion, while preventing line-of-sight exposure of the outer isolator 120 and the chamber wall 103 which can induce undesirable arcing. The gap 250 provides a good thermal break, thus isolating the outer isolator 120 from the high temperatures which could cause thermal stress and breakage. Advantageously, the processing chamber 100 experiences less equipment failure and downtime while providing uniformity in process results from one circuit to the next.

In operation, a substrate may be processed by forming plasma in a processing chamber 100 containing the substrate disposed on a substrate support 104. Characteristics of the plasma may be controlled by providing power to an electrode layer 108 disposed between the chamber wall 103 and the lid 180 of the processing chamber 100. The electrode layer 108 is isolated from the chamber wall 103 and the lid 180 by an outer ceramic isolator 120 and an inner ceramic isolator 110. The outer ceramic isolator 120 is in contact with the chamber wall 103 and the electrode layer 108, while the inner ceramic isolator 110 is in contact with the electrode layer 108 and a liner 164 disposed inward of the chamber wall 103 of the processing chamber 100. The inner ceramic isolator 110 does not contact the chamber wall 103 of the processing chamber 100. The substrate may be processed in the processing chamber 100 without cracking or damaging the inner ceramic isolator 110.

While the foregoing is directed to embodiments of the invention, other and further embodiments of the invention may be devised without departing from the basic scope thereof.

What is claimed is:

1. A processing kit for a plasma processing chamber, comprising:
 a plurality of ceramic arc-shaped pieces, each arc-shaped piece having a concave first end and a convex second end, the first end of each arc-shaped piece configured to mate with an adjacent end of a neighboring arc-shaped piece with a gap between the first end of the arc-shaped piece and the adjacent end of the neighboring arc-shaped piece to form a ring shaped inner isolator, wherein the concave first end and the convex second end are configured to prevent line-of-sight across the gap.

2. The processing kit of claim 1, wherein three ceramic arc-shaped pieces are configurable to form a ring.

3. The processing kit of claim 1, wherein each ceramic arc-shaped piece has an inner wall having a radius of about 7.499 inches to about 7.501 inches.

4. The processing kit of claim 1, wherein each ceramic arc-shaped piece has an outer wall having a radius of about 8.599 inches to about 8.601 inches.

5. The processing kit of claim 1, wherein each ceramic arc-shaped piece has a thickness of about 0.397 inches to about 0.403 inches.

6. The processing kit of claim 1, wherein the concave first end of each ceramic arc-shaped piece has a radius of about 0.550 inches.

7. The processing kit of claim 1, wherein the convex second end of each ceramic arc-shaped piece has a radius of about 0.550 inches.

8. The processing kit of claim 1, wherein each ceramic arc-shaped piece is fabricated from at least one of yttria ($Y_2O_3$), aluminum nitride (AlN), and alumina ($Al_2O_3$).

9. The processing kit of claim 1, wherein each ceramic arc-shaped piece is fabricated from at least 99% alumina ($Al_2O_3$) by weight.

10. A processing kit for a plasma processing chamber, comprising:
a plurality of ceramic arc-shaped pieces, each arc-shaped piece having a concave first end and a convex second end, the first end of each arc-shaped piece configured to mate with an adjacent end of a neighboring arc-shaped piece with a gap between the first end of each arc-shaped piece and the adjacent end of each neighboring arc-shaped piece to form a ring shaped inner isolator, wherein the concave first end and the convex second end are configured to prevent line-of-sight across the gap; and
a single piece ring shaped outer isolator that circumscribes the ring shaped inner isolator.

11. The processing kit of claim 10, wherein the outer isolator has a thickness that is the same as a thickness of the ring shaped inner isolator.

12. A processing kit for a plasma processing chamber, comprising:
a plurality of ceramic arc-shaped pieces, each arc-shaped piece having a concave first end and a convex second end, the first end of each arc-shaped piece configured to mate with an adjacent end of a neighboring arc-shaped piece to form a ring shaped inner isolator when inner walls of the arc-shaped pieces are on a common diameter, the first end of each arc-shaped piece having gaps defined between adjacent ends are configured that prevent line-of-sight between the inner wall and an outer wall when the outer and inner walls of the arc-shaped pieces are on a common diameter, wherein each ceramic arc-shaped piece comprises:
an inner wall having a radius of about 7.499 inches to about 7.501 inches;
an outer wall having a radius of about 8.599 inches to about 8.601 inches; and
a thickness of about 0.397 inches to about 0.403 inches.

13. The processing kit of claim 12, wherein the concave first end of each ceramic arc-shaped piece has a radius of about 0.55 inches and wherein the convex second end of each ceramic arc-shaped piece has a radius of about 0.55 inches.

14. The processing kit of claim 12, wherein the ceramic arc-shaped piece is fabricated from at least one of yttria ($Y_2O_3$), aluminum nitride (AlN), and alumina ($Al_2O_3$).

15. The processing kit of claim 12, wherein three ceramic arc-shaped pieces are configurable to form a ring.

16. The processing kit of claim 12 further comprising:
a single piece ring shaped outer isolator that circumscribes the ring shaped inner isolator.

17. The processing kit of claim 16, wherein the outer isolator further comprises a thickness that is the same as a thickness of the ring shaped inner isolator.

* * * * *